(12) United States Patent
Jung et al.

(10) Patent No.: US 8,641,453 B2
(45) Date of Patent: Feb. 4, 2014

(54) MEMORY MODULE AND METHOD OF MANUFACTURING A MEMORY MODULE

(75) Inventors: Jin-San Jung, Asan-si (KR); Jung-Chan Cho, Cheonan-si (KR); Hyun-Seok Choi, Asan-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 234 days.

(21) Appl. No.: 13/213,394

(22) Filed: Aug. 19, 2011

(65) Prior Publication Data
US 2012/0083139 A1 Apr. 5, 2012

(30) Foreign Application Priority Data
Oct. 5, 2010 (KR) .................. 10-2010-0096695

(51) Int. Cl.
*H01R 25/00* (2006.01)

(52) U.S. Cl.
USPC ........................................ 439/637; 439/951

(58) Field of Classification Search
USPC .............. 439/636, 637, 660, 55, 951
See application file for complete search history.

(56) References Cited

U.S. PATENT DOCUMENTS

| | | | | |
|---|---|---|---|---|
| 2,959,758 | A * | 11/1960 | Kehl et al. | 439/55 |
| 3,109,958 | A * | 11/1963 | Delachapelle et al. | 315/74 |
| 4,095,866 | A * | 6/1978 | Merrill | 439/60 |
| 4,464,832 | A * | 8/1984 | Asick et al. | 29/839 |
| 5,205,738 | A * | 4/1993 | Anderson et al. | 439/59 |
| 5,236,372 | A * | 8/1993 | Yunoki et al. | 439/260 |
| 5,468,920 | A * | 11/1995 | August | 174/267 |
| 5,713,126 | A * | 2/1998 | Sakemi | 29/843 |
| 5,865,631 | A * | 2/1999 | Berto et al. | 439/59 |
| 6,102,742 | A * | 8/2000 | Daly | 439/620.08 |
| 6,115,260 | A * | 9/2000 | Nakajima et al. | 361/760 |
| 6,634,561 | B1 * | 10/2003 | Wallace | 235/492 |
| 6,802,729 | B2 * | 10/2004 | Hermann et al. | 439/181 |
| 6,855,891 | B2 * | 2/2005 | Eguchi et al. | 174/250 |
| 7,134,884 | B2 * | 11/2006 | Wang et al. | 439/76.1 |
| 7,255,586 | B2 * | 8/2007 | Okada | 439/346 |
| 7,291,037 | B2 * | 11/2007 | Tsai | 439/492 |
| 7,303,400 | B2 * | 12/2007 | Sun et al. | 439/64 |
| 7,378,345 | B2 * | 5/2008 | Chou | 438/678 |
| 7,429,177 | B2 * | 9/2008 | Li | 439/77 |
| 7,916,486 | B2 * | 3/2011 | Takahashi | 361/720 |
| 2005/0181655 | A1 * | 8/2005 | Haba et al. | 439/331 |
| 2007/0259539 | A1 * | 11/2007 | Brown et al. | 439/66 |

FOREIGN PATENT DOCUMENTS

KR 102002009004 11/2002

* cited by examiner

*Primary Examiner* — Neil Abrams
*Assistant Examiner* — Travis Chambers
(74) *Attorney, Agent, or Firm* — Harness, Dickey & Pierce, P.L.C.

(57) ABSTRACT

A memory module may include a module substrate having a side portion. The side portion may be adapted or configured to be inserted into a socket of a main board. A plurality of connection pads may be arranged along the side portion. The connection pads may have a step portion of a first height from a surface of the side portion and a contact portion of a second height that is greater than the first height from the surface of the side portion. At least one semiconductor package may be mounted on the module substrate and electrically connected to the connection pads.

19 Claims, 6 Drawing Sheets

MEMORY MODULE AND METHOD OF MANUFACTURING A MEMORY MODULE

PRIORITY STATEMENT

This application claims priority under 35 U.S.C. §119 to Korean Patent Application No. 10-2010-0096695, filed on Oct. 5, 2010 in the Korean Intellectual Property Office (KIPO), the entire contents of which are herein incorporated by reference.

BACKGROUND

1. Field

Example embodiments relate to a memory module and a method of manufacturing the memory module. More particularly, example embodiments relate to a memory module including connection pads that are inserted into a socket of a main board to provide electrical connection with the main board and a method of manufacturing the memory module.

2. Description of the Related Art

Generally, a memory module includes a module substrate and a plurality of semiconductor packages mounted on the module substrate. The semiconductor packages may be mounted on at least one surface of the module substrate such as a printed circuit board.

The memory module is inserted into a socket and then mounted on a main board. The memory module may be electrically connected to the main board through tabs such as a connection pad.

The connection pad of the memory module may be formed to have a desired height from the module substrate. When the memory module is inserted into the socket, an insertion force may be exerted by connector pins of the socket. However, due to the height of the connection pad, the force required for insertion of the memory module may be increased, thereby causing potential damage to the memory module and short-circuit problems between adjacent connection pads.

SUMMARY

Some example embodiments relate to a memory module including connection pads configured to reduce an insertion force that is involved when the memory module is inserted into a socket of a main board.

Some example embodiments also relate to a method of manufacturing the memory module.

According to an example embodiment, a memory module may include a module substrate having a side portion, the side portion being adapted or configured to be inserted into a socket of a main board, a plurality of connection pads arranged on the module substrate along the side portion, the connection pad having a step portion of a first height from a surface of the module substrate and a contact portion of a second height greater than the first height from the surface of the module substrate, and at least one semiconductor package mounted on the module substrate and electrically connected to the connection pads.

In an example embodiment, the step portion and the contact portion may be sequentially arranged from the side portion.

In an example embodiment, the connection pad may further include a connection portion between the step portion and the contact portion and the connection portion. The connection portion may have a gentle or gradual slope.

In an example embodiment, the step portion may have a multi-step structure. The step portion may include a first step portion of the first height, and a second step portion of an intermediate height. The intermediate height may be greater than the first height and smaller than the second height.

In an example embodiment, the connection pads may include a plurality of first and second pads arranged alternately with each other. The first contact portion of the first pad may be spaced apart by a first distance from a side surface of the side portion, and the second contact portion of the second pad may be spaced apart by a second distance greater than the first distance from the side surface of the side portion.

In an example embodiment, the side portion of the module substrate may be configured for insertion by an interference, tension, or friction fit within the socket of the main board. The module substrate may be configured such that a connector pin of the socket may arrive at the contact portion of the connection pad via the step portion.

In an example embodiment, the connection pad may have a rectangular shape.

In an example embodiment, the step portion and the contact portion may be integrally formed with each other.

According to some example embodiments, in a method of manufacturing a memory module, a substrate having a side portion may be prepared. The side portion may be adapted or configured to be inserted into a socket of a main board. First pad patterns may be formed along the side portion on the substrate. A mask pattern may be formed on the first pad patterns to cover end portions of the first pad patterns. Second pad patterns may be formed on surfaces of the first pad patterns exposed by the mask pattern. The mask pattern may be removed to form a plurality of connection pads, the connection pad having a step portion of a first height from a surface of the substrate and a contact portion of a second height greater than the first height from the surface of the substrate. At least one semiconductor package may be mounted on the substrate such that the semiconductor package is electrically connected to one or more of the connection pads.

In an example embodiment, forming the second pad patterns may include performing a plating process to form the second pad patterns on the first pad patterns.

In an example embodiment, the first pad pattern may include a seed layer that is connected to a plating wire.

In an example embodiment, the step portion and the contact portion may be sequentially arranged from the side portion.

In an example embodiment, the connection pad may further include a connection portion between the step portion and the contact portion. The connection portion may have a gentle or gradual slope.

In an example embodiment, the step portion may have a multi-step structure.

According to some example embodiments, a memory module may include a plurality of connection pads that are arranged along a side portion of a module substrate. The connection pad may have a step portion of a first height from a surface of the side portion and a contact portion of a second height greater than the first height from the surface of the side portion. The step portion may have at least one step like a staircase.

Accordingly, an initial force as well as the total force required for insertion of the module substrate may be decreased to thereby reduce or prevent damage to the memory module when the memory module is inserted into a main board.

BRIEF DESCRIPTION OF THE DRAWINGS

Example embodiments may be more clearly understood when the following detailed description is taken in conjunction with the accompanying drawings. FIGS. 1 to 12 represent non-limiting, example embodiments as described herein.

DETAILED DESCRIPTION

Various examples will be described more fully hereinafter with reference to the accompanying drawings, in which non-limiting embodiments are shown. Example embodiments may, however, be embodied in many different forms and should not be construed as limited to those set forth herein. Rather, these example embodiments are merely provided so that this disclosure will be more thorough and complete so as to fully convey the scope of example embodiments to those skilled in the art. In the drawings, the sizes and relative sizes of the various layers and/or regions may have been exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in further detail with reference to the accompanying drawings.

Figure 1:
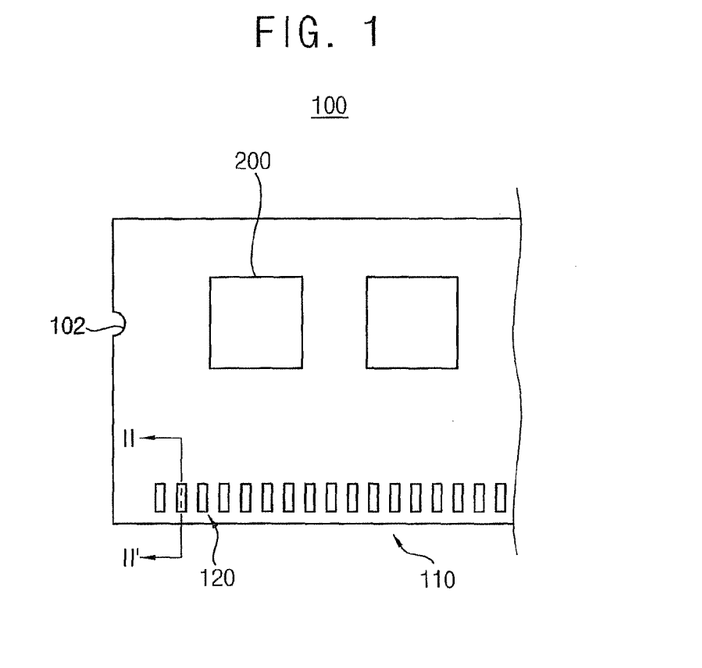
FIG. 1 is a plan view illustrating a memory module in accordance with an example embodiment.
Figure 2:
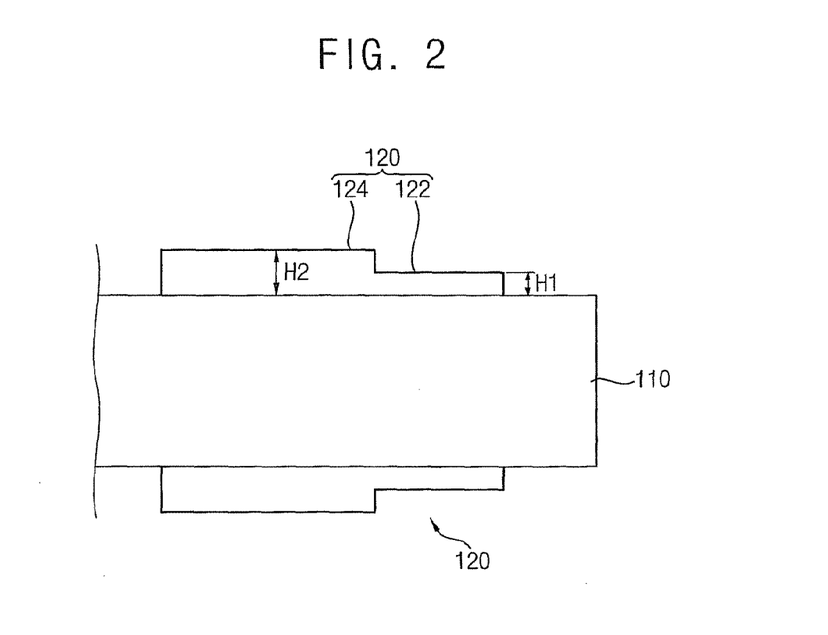
FIG. 2 is a cross-sectional view taken along the line II-II' in FIG. 1.
Figure 3:
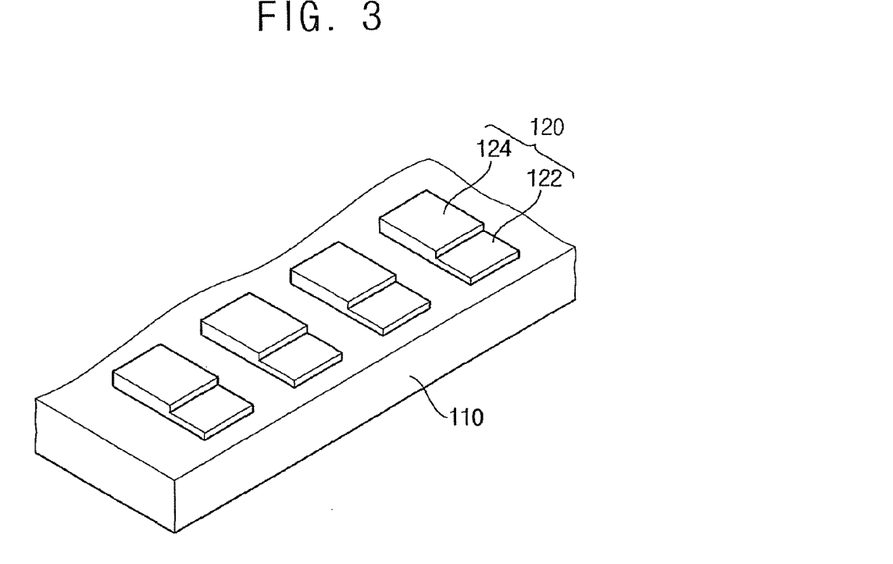
FIG. 3 is a perspective view illustrating connection pads of the memory module in FIG. 1.

FIG. 1 is a plan view illustrating a memory module in accordance with an example embodiment. FIG. 2 is a cross-sectional view taken along the line II-If in FIG. 1. FIG. 3 is a perspective view illustrating connection pads of the memory module in FIG. 1.

Referring to FIG. 1, a memory module 100 according to an example embodiment may include a module substrate, a plurality of connection pads 120 formed along a side portion 110 of the module substrate and a plurality of semiconductor packages 200 mounted on the module substrate.

In an example embodiment, the module substrate may include a printed circuit board having circuit wirings not illustrated) formed therein. The module substrate may have a side portion 110 that is a portion adapted or configured to be inserted into a main board. The side portion 110 of the module substrate may be inserted into a socket of the main board.

A plurality of the connection pads 120 may be arranged along the side portion 110 of the module substrate. The connection pads 120 may be spaced apart from one another along the side portion 110 of the module substrate. The module substrate may a first surface and a second surface opposite to the first surface. The connection pads 120 may be arranged on the first surface and the second surface along the side portion 110. The connection pad 120 may be connected to the circuit wiring of the module substrate. The module substrate may further have a slot 102 in another side portion thereof for insertion and arrangement of the module substrate.

In an example embodiment, the module substrate may be inserted into a socket of the main board. The socket may have a female connector. Accordingly, the memory module 100 may be electrically connected to the main board by the connection pads 120.

A plurality of the semiconductor packages 200 may be mounted on the first surface or the second surface of the module substrate. The semiconductor package 200 may be electrically connected to the connection pads 120 by the circuit wirings. For example, the semiconductor package 200 may be a chip scale package, a board on chip package, or a stack package in combination thereof. The semiconductor package 200 may be mounted on the module substrate by a solder adhesion process, although example embodiments are not limited thereto.

As illustrated in FIGS. 2 and 3, the connection pad 120 on the side portion 110 of the module substrate may include a step portion 122 and a contact portion 124. The connection pad 120 may be spaced apart by a desired distance from a side surface of the side portion 110. Although not illustrated, an end portion of the connection pad 120 may be connected to an inner plating wire that is used to perform a plating process for forming the connection pad 120.

In an example embodiment, the step portion 122 and the contact portion 124 may be sequentially arranged from the side portion 110 of the module substrate. The step portion 122 may have at least one step like a staircase. The step portion 122 and the contact portion 124 may be integrally formed with each other.

The step portion 122 of the connection pad 120 may have a first height (H1) from a surface of the module substrate. The contact portion 124 of the connection pad 120 may have a second height (H2) from the surface of the module substrate. Accordingly, the step portion 122 may provide a step between the surface of the module substrate and the surface of the contact portion 124. Alternatively, although not illustrated, the thickness of the step portion 122 may increase gradually from the surface of the module substrate toward the surface of the contact portion 124. In such a case, the step portion 122 may have a triangular or trapezoidal sectional shape.

For example, the side portion 110 of the module substrate may have a thickness of about 1 mm to about 1.5 mm. The contact portion 124 of the connection pad 120 may have the second height (H2) of about 40 μm to about 50 μm. The first height (H1) of the step portion may range from ¼ to ¾ of the second height (H2) of the contact portion 124. The connection pad 120 may have a rectangular shape based on a plan view.

Figure 4:
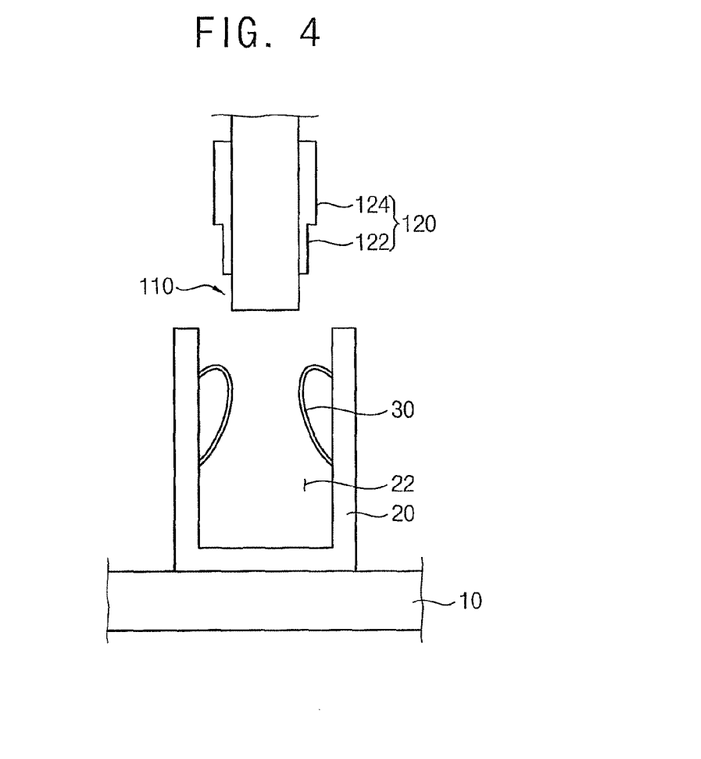
FIG. 4 is a cross-sectional view illustrating a memory module that is arranged to be inserted into a socket of a main board in accordance with an example embodiment.
Figure 5:
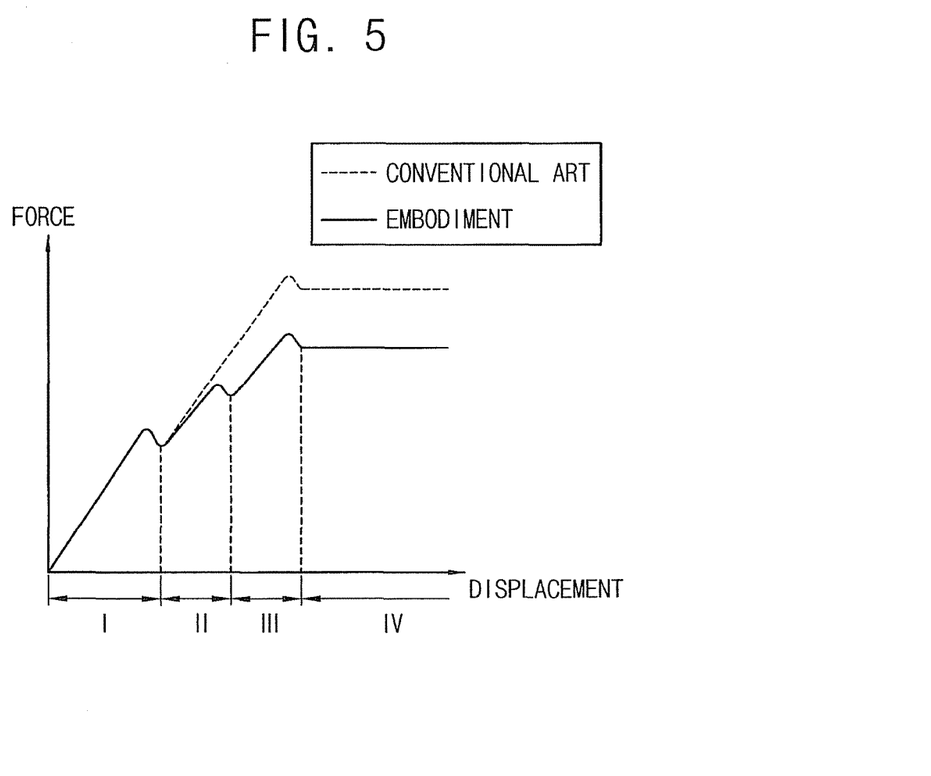
FIG. 5 is a graph of a force exerted on a connector pin of the socket as a function of displacement when the memory module is inserted into the socket in FIG. 4.

FIG. 4 is a cross-sectional view illustrating a memory module that is arranged to be inserted into a socket of a main board in accordance with an example embodiment. FIG. 5 is a graph of a force exerted on a connector pin of the socket as a function of displacement when the memory module is inserted into the socket in FIG. 4.

Referring FIG. 4, the side portion 110 of the module substrate may be inserted into a socket 20 of a main board 10. The socket 20 may have an opening 22 for insertion of the side portion 110. Connector pins 30 of the socket 20 may be arranged sequentially to correspond to the connection pads 120.

In an example embodiment, the side portion 110 may be inserted by an interference, tension, or friction fit within the socket 20 of the main board 10. The connector pin 30 of the socket 20 may arrive safely at the contact portion 124 of the connection pad 120 via the step portion 122.

Referring to FIG. 5, the connector pin 30 may deform along an upper surface and a side surface of the side portion 110 of the module substrate in section I, deform along the step portion 122 of the connection pad 120 in section II, deform along the contact portion 124 of the connection pad 120 in section III, and then, arrive at the contact portion 124 in section IV.

As illustrated in FIG. 5, a force exerted on a conventional connector pin is shown by dotted lines. Compared with a conventional connector pin, the force exerted on the connector pin when the memory module according to an example embodiment is inserted may increase in multi-stages, and thus, the total force required for insertion may be decreased.

As mentioned above, the memory module 100 may include the connection pad 120 having the step portion 122. The step portion 122 may have al least one step like a staircase. Accordingly, the initial force as well as the total force required for insertion of the module substrate may be decreased, thereby preventing damage to the memory module 100 when the memory module 100 is inserted into a main board 10.

Hereinafter, a method of manufacturing a memory module in accordance with an example embodiment will be explained.

FIGS. 6 to 9 are cross-sectional views illustrating a method of manufacturing the memory module in FIG. 1.

Figure 6:
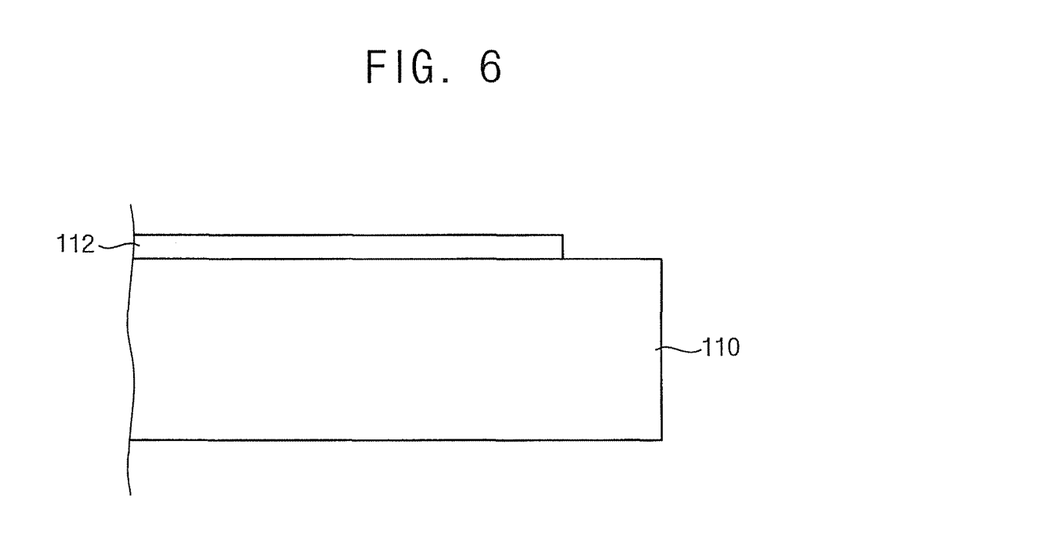
FIGS. 6 to 9 are cross-sectional views illustrating a method of manufacturing the memory module in FIG. 1.

Referring to FIG. 6, a substrate having a side portion 110 is prepared. The side portion 110 may be configured for insertion into a socket of a main board. The substrate may have a first surface and a second surface opposite to the first surface. First pad patterns 112 may be formed on the first surface along the side portion 110 of the substrate.

In an example embodiment, circuit wirings (not illustrated) may be formed in the substrate. For example, after a conductive layer such as a copper foil is formed on the first surface of substrate, the conductive layer may be patterned to form the circuit wiring. When the circuit wiring is formed, the first pad patterns 112 may be formed together along the side portion 110. The first pad pattern 112 may be electrically connected to the circuit pattern. In this case, the first pad pattern 112 may include a seed layer that is connected to a plating wire for a following plating process. For example, the seed layer may include copper.

Figure 7:
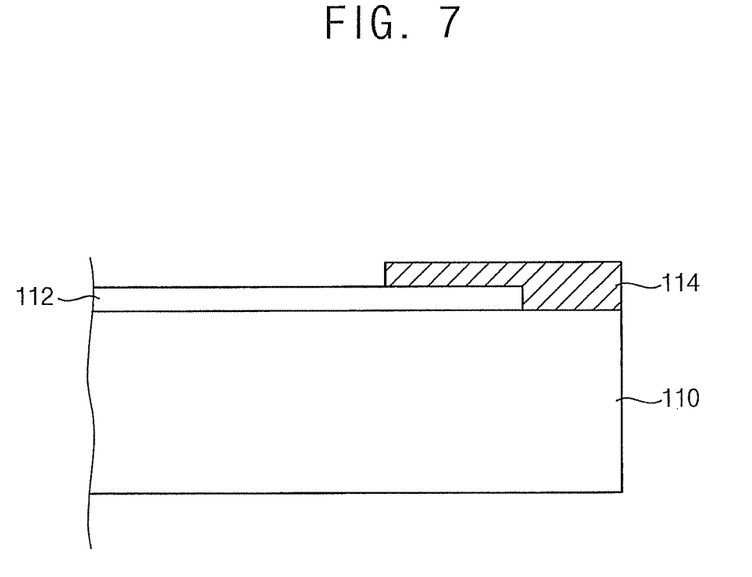

Referring to FIG. 7, a mask pattern 114 is formed on the first pad patterns 112 to cover end portions of the first pad pattern 112. For example, the mask pattern 114 may be formed using an insulating material such as silicon oxide or polymer. Accordingly, the end portions of the first pad patterns 112 may be covered by the mask pattern 114.

Figure 8:
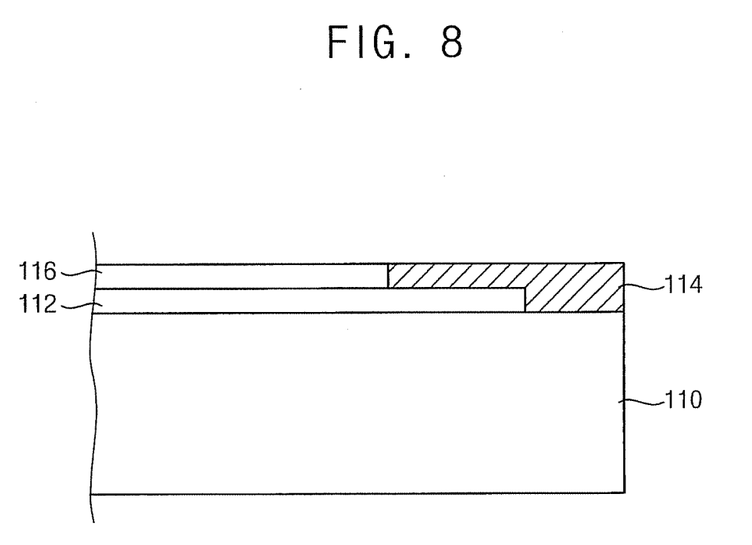

Referring to FIG. 8, second pad patterns 116 are formed on the first pad patterns 112 such that the end portions of the first pad pattern 112 are respectively exposed by the second pad patterns 116.

For example, a plating process may be performed such that the first pad pattern 112 is used as a plating electrode to form the second pad pattern 116.

Figure 9:
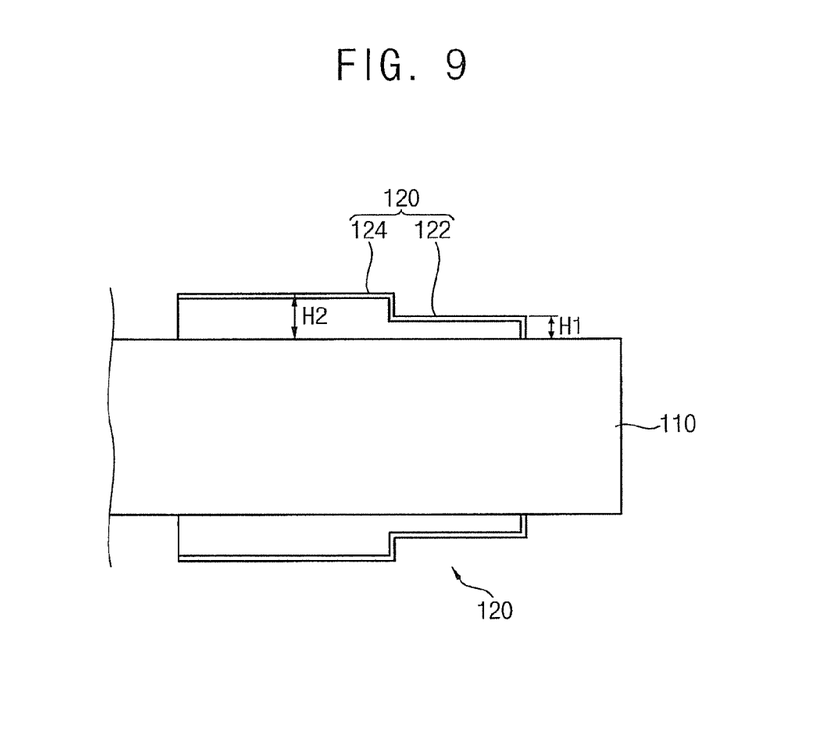

Referring to FIG. 9, the mask pattern 114 is removed from the substrate to form a plurality of connection pads 120 having a step portion 122 and a contact portion 124 along the side portion 110 of the substrate.

After the mask pattern 114 is removed from the substrate, an additional conductive layer may be formed on the first and second pad patterns 112, 116. Then, the first and second pad patterns 112, 116 may be patterned to form the connection pad 120 having the step portion 122 and the contact portion 124.

For example, the additional conductive layer may be formed using gold (Au) or nickel (Ni). The additional conductive layer may have a single-layered or multi-layered structure. The process of forming the additional conductive layer or the process of patterning the first and second pad patterns 112 and 116 may be performed selectively or omitted for simplicity.

Then, the above-mentioned processes may be performed on the second surface of the substrate to form another connection pad 120 on the second surface of the substrate. Alternatively, the connection pads 120 may be formed simultaneously on the first and second surfaces of the substrate.

At least one semiconductor package 200 may be mounted on the substrate such that the semiconductor package 200 is electrically connected to the connection pads 120 to complete the memory module 100 in FIG. 1.

Figure 10:
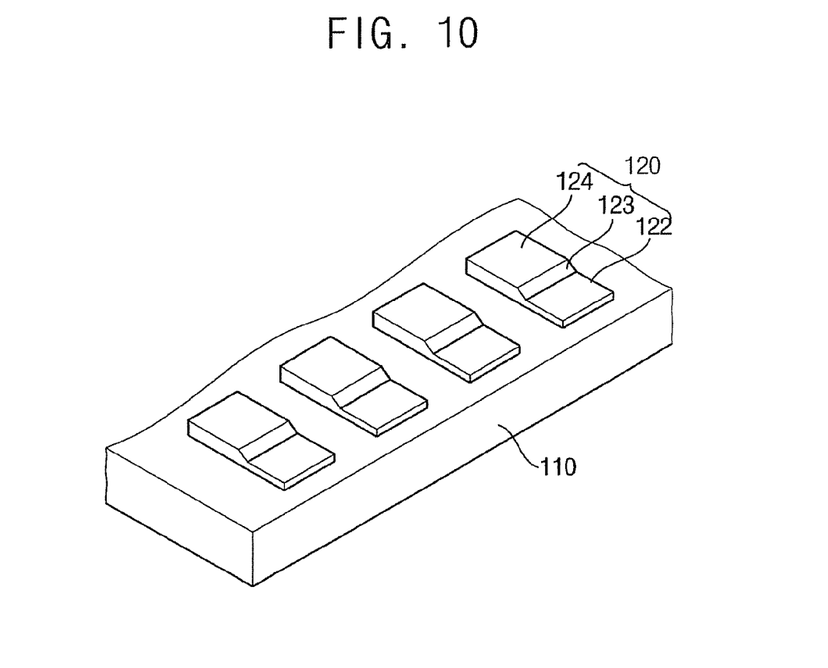
FIGS. 10 to 12 are perspective views illustrating various connection pads of a memory module in accordance with other example embodiments.
Figure 11:
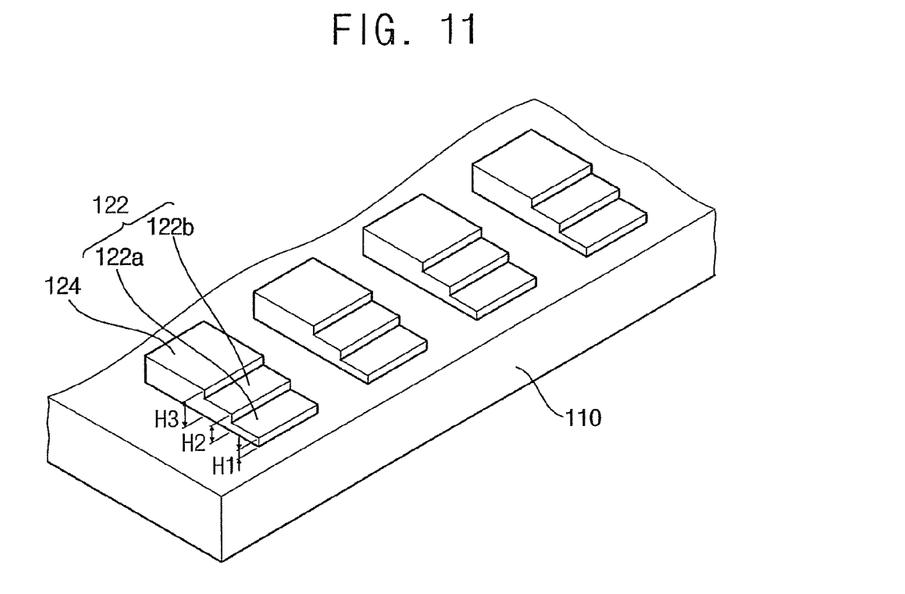
Figure 12:
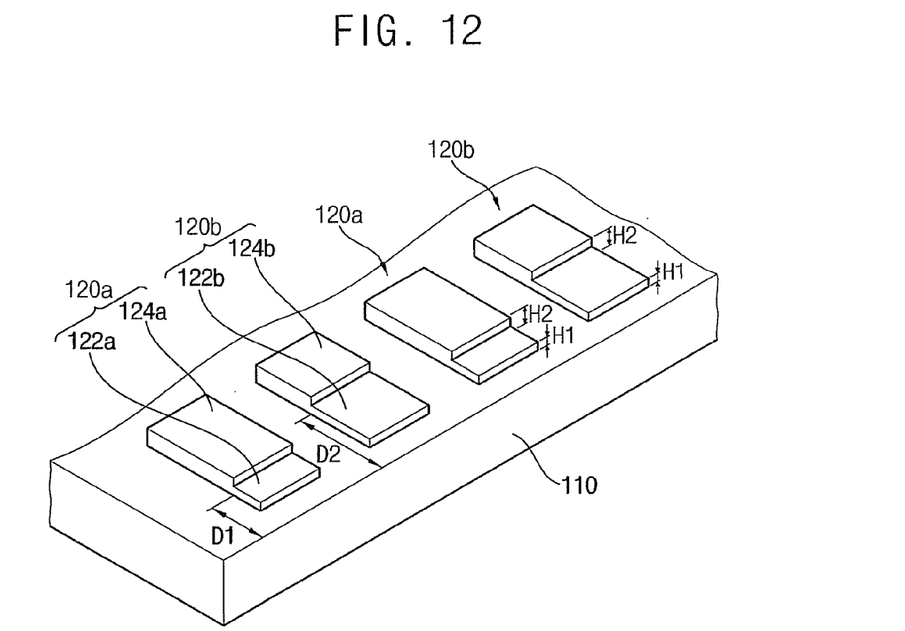

FIGS. 10 to 12 are perspective views illustrating various connection pads of a memory module in accordance with other example embodiments.

Referring to FIG. 10, the connection pad 120 may further have a connection portion 123 between the step portion 122 and the contact portion 124. The connection portion 123 may have a relatively gradual or gentle slope.

Accordingly, when the connector pin moves from the step portion 122 to the contact portion 124, the force exerted on the connector pin may change gradually or gently as a result of the connection portion 123 so that the memory module can be inserted with relative ease into the main board.

In the process of forming the mask pattern 114 in FIG. 8, additional processes may be performed to form the connection portion 123 of the connection pad 120.

For example, first and second mask patterns having a different etch selectivity may be formed to cover end portions of the first pad patterns 112. The first mask pattern may be formed only on the end portion of the first pad pattern 112. The first mask pattern may have a gradual or gentle slope to define the connection portion 123. The second mask pattern may be formed on the first mask pattern and the side portion 110 of the module substrate. Then, only the first mask pattern may be removed and then the second pad pattern may be formed on the first pad pattern that is exposed by the second mask pattern to form the connection portion 123 and the contact portion 124 of FIG. 10.

Alternatively, after the second pad pattern 116 is formed on the first pad pattern 112, the second pad pattern 116 may be partially removed to form the connection portion 123 and the contact portion 124 of FIG. 10.

Referring to FIG. 11, the step portion 122 of the connection pad 120 may have a multi-stepped structure. The step portion 122 may have a first step portion 122a of a first height (H1) and a second step portion 122b of a second height or intermediate height (H2) that is greater than the first height (H1). The contact portion 124 of the connection pad 120 may have a third height (H3) that is greater than the second height (112).

Accordingly, because the connector pin moves gradually or gently from the side portion 110 to the contact portion 124, the memory module can be inserted with relative ease into the main board.

The same or similar processes to the processes illustrated in FIGS. 7 and 8 may be performed to form the step portion 122 having a multi-stepped structure.

Referring to FIG. 12, a plurality of first and second pads 120a and 120b may be formed along the side portion 110 of the module substrate. The first and second pads 120a and 120b may be arranged alternately along the side portion 110. The first contact portion 124a of the first pad 120a may be spaced apart by a first distance (D1) from the side surface of the side portion 110. The second contact portion 124b of the second pad 120b may be spaced apart by a second distance (D2) that is greater than the first distance (D1) from the side surface of the side portion 110.

As illustrated in FIG. 12, the first and second pads 120a and 120b may be arranged alternately with each other. A first group of adjacent first pads 120a and a second group of adjacent second pads 120b may be formed along the side portion 110.

Accordingly, some connector pins may make contact with the first contact portions 124a of the first pads 120a, while other connector pins may make contact with the second contact portion 124b of the second pads 120b. Because an initial force is exerted partially on some of the total connector pins, the initial force may be decreased when the memory module is inserted into a main board.

In order to form the above first and second pads 120a and 120b, in the process of forming the mask pattern 114 in FIG. 7, the mask pattern 114 may be formed to have a concave structure. The end portions of the first pad patterns 112 covered by the mask pattern 114 of the concave structure may be spaced apart by different distances from the side surface of the side portion 110.

As mentioned above, a memory module in accordance with example embodiments may include a plurality of connection pads that are arranged along a side portion of a module substrate. The connection pad may have a step portion of a first height from a surface of the side portion and a contact portion of a second height that is greater than the first height from the surface of the side portion. The step portion may have at least one step like a staircase.

Accordingly, an initial force as well as the total force required for insertion of the module substrate may be decreased to thereby prevent damage to the memory module when the memory module is inserted into a main board.

The foregoing is merely illustrative of example embodiments and is not to be construed as limiting thereof. Although a few example embodiments have been described, those skilled in the art will readily appreciate that many modifications are possible without materially departing from the novel teachings and advantages of the present invention. Accordingly, all such modifications are intended to be included within the scope of example embodiments as defined in the claims. In the claims, means-plus-function clauses (if applicable) are intended to cover the structures described herein as performing the recited function and not only structural equivalents but also equivalent structures. Therefore, it is to be understood that the foregoing is merely illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory module, comprising:
    a module substrate having a side portion, the side portion configured for insertion into a socket of a main board;
    a plurality of connection pads on the module substrate along the side portion, one or more of the plurality of connection pads having a step portion and a contact portion, the step portion being of a first height from a surface of the module substrate, the contact portion being of a second height from the surface of the module substrate, the second height being greater than the first height; and at least one semiconductor package on the module substrate, the at least one semiconductor package electrically connected to one or more of the plurality of connection pads, wherein the side portion of the module substrate is configured for insertion by an interference fit within the socket of the main board, the module substrate configured such that a connector pin of the socket arrives at the contact portion of the plurality of connection pads via the step portion.

2. The memory module of claim 1, wherein the step portion and the contact portion are sequentially arranged from the side portion.

3. The memory module of claim 1, wherein one or more of the plurality of connection pads further comprise a connection portion between the step portion and the contact portion, the connection portion having a sloping surface.

4. The memory module of claim 1, wherein the plurality of connection pads comprise a plurality of first and second pads arranged alternately with each other, the first pads including a first contact portion spaced apart from the side portion by a first distance, the second pads including a second contact portion spaced apart from the side portion by a second distance, the second distance greater than the first distance.

5. The memory module of claim 1, wherein the plurality of connection pads have a rectangular shape.

6. The memory module of claim 1, wherein the step portion and the contact portion are integrally formed with each other.

7. The memory module of claim 1, wherein the step portion has a multi-step structure.

8. The memory module of claim 7, wherein the step portion comprises a first step portion of the first height and a second step portion of an intermediate height, the intermediate height being greater than the first height and smaller than the second height.

9. A method of manufacturing a memory module, comprising:

forming first pad patterns along a side portion of a substrate, the side portion configured for insertion into a socket of a main board;

forming a mask pattern on the first pad patterns to cover end portions of the first pad patterns;

forming second pad patterns on surfaces of the first pad patterns exposed by the mask pattern;

removing the mask pattern to form a plurality of connection pads, one or more of the plurality of connection pads having a step portion and a contact portion, the step portion being of a first height from a surface of the substrate, the contact portion being of a second height from the surface of the substrate, the second height being greater than the first height; and mounting at least one semiconductor package on the substrate such that the at least one semiconductor package is electrically connected to one or more of the plurality of connection pads, wherein the side portion of the substrate is configured for insertion by an interference fit within the socket of the main board, the substrate configured such that a connector pin of the socket arrives at the contact portion of the plurality of connection pads via the step portion.

10. The method of claim 9, wherein the forming second pad patterns comprises performing a plating process to form the second pad patterns on the first pad patterns.

11. The method of claim 9, wherein the forming second pad patterns comprises connecting a plating wire to a seed layer of the first pad patterns.

12. The method of claim 9, wherein the step portion and the contact portion are sequentially arranged from the side portion.

13. The method of claim 9, wherein one or more of the plurality of connection pads further comprise a connection portion between the step portion and the contact portion, the connection portion having a sloping surface.

14. The memory module of claim 9, wherein the step portion has a multi-step structure.

15. A memory module, comprising:

a module substrate having a first primary surface, a second primary surface opposite to the first primary surface, and an end face between the first and second primary surfaces;

connection pads on the first primary surface of the module substrate along the end face, one or more of the connection pads having a step portion and a contact portion, the step portion being of a first height from the first primary surface, the contact portion being of a second height from the first primary surface, the second height being greater than the first height; and at least one semiconductor package on the module substrate, the at least one semiconductor package disposed farther from the end face than the connection pads, the at least one semiconductor package electrically connected to one or more of the connection pads, wherein the end face of the module substrate is configured for insertion by an interference fit within a socket of a main board, the module substrate configured such that a connector pin of the socket arrives at the contact portion of the connection pads via the step portion.

16. The memory module of claim 15, further comprising: connection pads on the second primary surface of the module substrate along the end face.

17. The memory module of claim 15, wherein the step portion of the connection pads is disposed closer to the end face of the module substrate than the contact portion.

18. The memory module of claim 15, wherein one or more of the connection pads include a connection portion, the connection portion sloping from the contact portion down to the step portion.

19. The memory module of claim 15, wherein the connection pads include first pads and second pads alternately arranged with each other along the end face, the first pads including a first contact portion disposed a first distance from the end face, the second pads including a second contact portion disposed a second distance from the end face, the second distance greater than the first distance.

* * * * *